United States Patent
Jang

(10) Patent No.: US 7,760,553 B2
(45) Date of Patent: Jul. 20, 2010

(54) FUSE CIRCUIT AND FLASH MEMORY DEVICE HAVING THE SAME

(75) Inventor: Chae Kyu Jang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 286 days.

(21) Appl. No.: 12/016,782

(22) Filed: Jan. 18, 2008

(65) Prior Publication Data

US 2009/0052247 A1  Feb. 26, 2009

(30) Foreign Application Priority Data

Aug. 22, 2007  (KR) .................... 10-2007-0084570

(51) Int. Cl.
*G11C 11/34* (2006.01)
*G11C 16/06* (2006.01)
*G11C 17/00* (2006.01)
*G11C 17/18* (2006.01)

(52) U.S. Cl. .............. 365/185.22; 365/96; 365/225.7

(58) Field of Classification Search ............ 365/185.22, 365/225.7, 96
See application file for complete search history.

(56) References Cited

U.S. PATENT DOCUMENTS

| 2003/0016566 A1* | 1/2003 | Yamaki et al. | 365/189.09 |
| 2006/0146610 A1* | 7/2006 | Takeuchi et al. | 365/185.17 |

FOREIGN PATENT DOCUMENTS

| KR | 10-2000-0004714 A | 1/2000 |
| KR | 10-2003-0016057 A | 2/2003 |
| KR | 10-2005-0108980 A | 11/2005 |
| KR | 10-2006-0036684 A | 5/2006 |

* cited by examiner

*Primary Examiner*—Ly D Pham
(74) *Attorney, Agent, or Firm*—Townsend and Townsend and Crew LLP

(57) ABSTRACT

A fuse circuit in a flash memory device is disclosed. The fuse circuit includes a plurality of memory cells turned on/off by a first voltage in accordance with program state, a switching circuit configured to switch in response to a control signal, thereby transmitting a verifying signal for verifying program of the memory cell to the memory cell, and a cell controller configured to output the verifying signal for controlling program, verification and erase of the memory cells and the control signal.

1 Claim, 5 Drawing Sheets

US 7,760,553 B2

FUSE CIRCUIT AND FLASH MEMORY DEVICE HAVING THE SAME

CROSS-REFERENCE TO RELATED APPLICATIONS

This application claims priority from Korean Patent Application No. 2007-84750 filed on Aug. 22, 2007, the contents of which are incorporated herein by reference in its entirety.

BACKGROUND OF THE INVENTION

The present invention relates to a flash memory device and more particularly to a method of reducing the size of a fuse circuit used in providing option information during power up of a flash memory device.

Recently, efforts for enhancing mobile devices such as a camcorder, a digital camera, a portable phone, an MP3 (MPEG-1 Layer3) player, etc has been performed accordingly as the demand for the mobile devices increases.

A NAND flash memory device employed in the mobile device operates in accordance with an application program, wherein initialization of the NAND flash memory device is determined in accordance with the operation characteristic of the mobile device.

Generally, a fuse circuit for storing option information in the flash memory device is made up of poly or metal, etc, and stores the option information through an electrical cutting method.

The fuse circuit is also employed in a repair circuit for repair operation in a flash memory device.

FIG. 1 is a view illustrating a repair address circuit in a common flash memory device.

In FIG. 1, the repair address circuit stores repair address information A<1:4> of 4 bits, and includes a P-MOS transistor P, a first to ninth N-MOS transistors N1 to N9, and a first to eighth fuses F1 to F8. Here, the repair address information is stored in the repair address circuit by cutting the first fuse F1 to the eighth fuse F8.

In the case that input address A<1:4> is identical to the repair address stored in the repair address circuit, a current path is formed from the P-MOS transistor P to the ninth N-MOS transistor N9. As a result, the P-MOS transistor P is coupled to a ground through the current path, and so a repair signal is outputted.

As described above, the flash memory device has repair address circuits for storing the repair address information corresponding to the addresses. Accordingly, many fuses are needed in the repair address circuits.

The flash memory device uses not only the repair address circuit but also a lot of sub-fuse circuits for storing various option information so as to enhance yield of the flash memory device.

However, the sub-fuse circuits occupy much space compared to a transistor, thereby affecting the size of a memory chip. In addition, in the case that the sub-fuse circuit is cut, the sub-fuse circuit cannot be connected again. As a result, yield may be lowered due to a cutting error.

SUMMARY OF THE INVENTION

It is a feature of the present invention to provide a fuse circuit using memory cell to occupy small space and be reused and a flash memory device having the same.

A fuse circuit according to one example embodiment of the present invention includes a plurality of memory cells turned on/off by a first voltage in accordance with program state; a switching circuit configured to switch in response to a control signal, thereby transmitting a verifying signal for verifying program of the memory cell to the memory cell; and a cell controller configured to output the verifying signal for controlling program, verification and erase of the memory cells and the control signal.

The memory cell is programmed, and is turned off by the first voltage so as to cut the fuse circuit.

The first voltage is a voltage for turning on the memory cell under the condition that the memory cell is erased.

A flash memory device according to one example embodiment of the present invention includes a main cell array configured to have memory cells for storing data; a redundancy cell array configured to have memory cells for repairing the memory cell of the main cell array to which error is occurred; a page buffer circuit configured to perform a program operation, a verifying operation and a read operation about the main cell array and the redundancy cell array; a repair circuit configured to include a fuse circuit having memory cells turned on/off by a first voltage in accordance with program state so as to store address information of the memory cell to which error is occurred; and a data input/output controller configured to control input/output of data to/from the main memory cell or the redundancy memory cell in accordance with a repair signal outputted from the repair circuit.

The fuse circuit includes the memory cells turned on/off by the first voltage in accordance with program state; a switching circuit configured to switch in response to a control signal, thereby transmitting a verifying signal for verifying program of the memory cell to the memory cell; and a cell controller configured to output the verifying signal for controlling program, verification and erase of the memory cells and the control signal.

The memory cell is programmed, and is turned off by the first voltage so as to cut the fuse circuit.

The first voltage is a voltage for turning on the memory cell under the condition that the memory cell is erased.

An NAND flash memory device having memory cells for storing data according to another example embodiment of the present invention includes a fuse circuit configured to store option information for operation of the flash memory device in the memory cells in accordance with program state of the memory cell; and a memory chip configured to store data in accordance with the option information stored in the fuse circuit.

The memory chip includes a memory cell array configured to have memory cells coupled to pairs of bit lines and word lines; a page buffer circuit configured to have page buffers coupled to a pair of bit lines, and for programming data in a selected memory cell and reading data from the selected memory cell; an X decoder configured to select a word line in the memory cell array in accordance with an address inputted through an input/output controller; and an Y decoder coupled to the page buffers and a data input/output line, and configured to transmit data to be programmed to a corresponding page buffer or output read data transmitted from the page buffer through the data input/output line.

The fuse circuit includes the memory cells turned on/off by the first voltage in accordance with program state; a switching circuit configured to switch in response to a control signal, thereby transmitting a verifying signal for verifying program of the memory cell to the memory cell; and a cell controller configured to output the verifying signal for controlling program, verification and erase of the memory cells and the control signal.

The memory cell is programmed, and is turned off by the first voltage so as to cut the fuse circuit.

The first voltage is a voltage for turning on the memory cell under the condition that the memory cell is erased.

As described above, a fuse circuit and a flash memory device having the same of the present invention use a memory cell, and cut a cell fuse without extra element for fuse cutting. Accordingly, in case that error is occurred to the fuse circuit, the error may be easily amended. In addition, since the cell fuse occupying small space compared to a physical fuse is used, space which the fuse circuit occupies in the flash memory device may be reduced.

DESCRIPTION OF SPECIFIC EMBODIMENTS

Hereinafter, the embodiments of the present invention will be explained in more detail with reference to the accompanying drawings.

Figure 1:
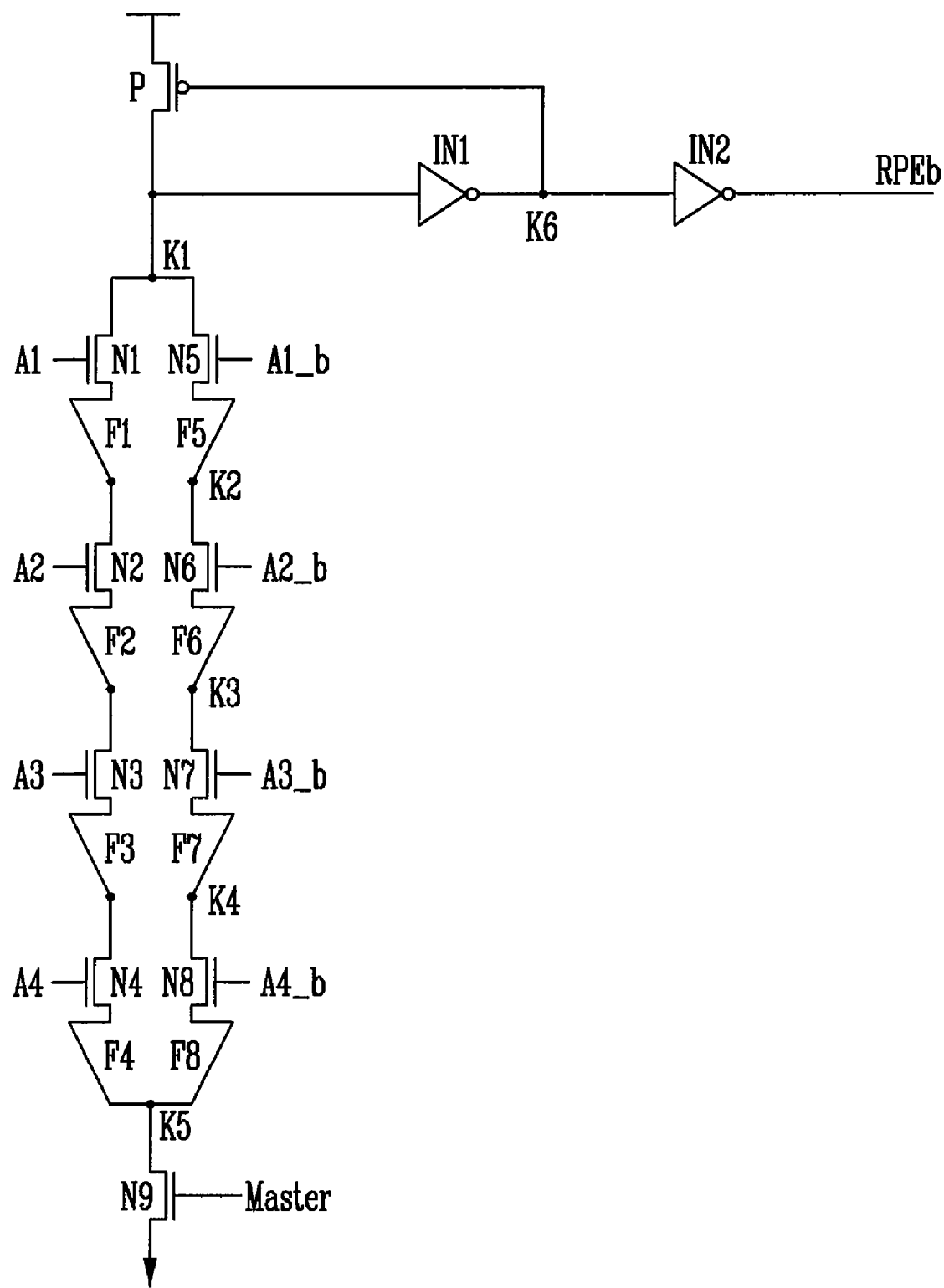
FIG. 1 is a view illustrating a repair address circuit in a common flash memory device.
Figure 2A:
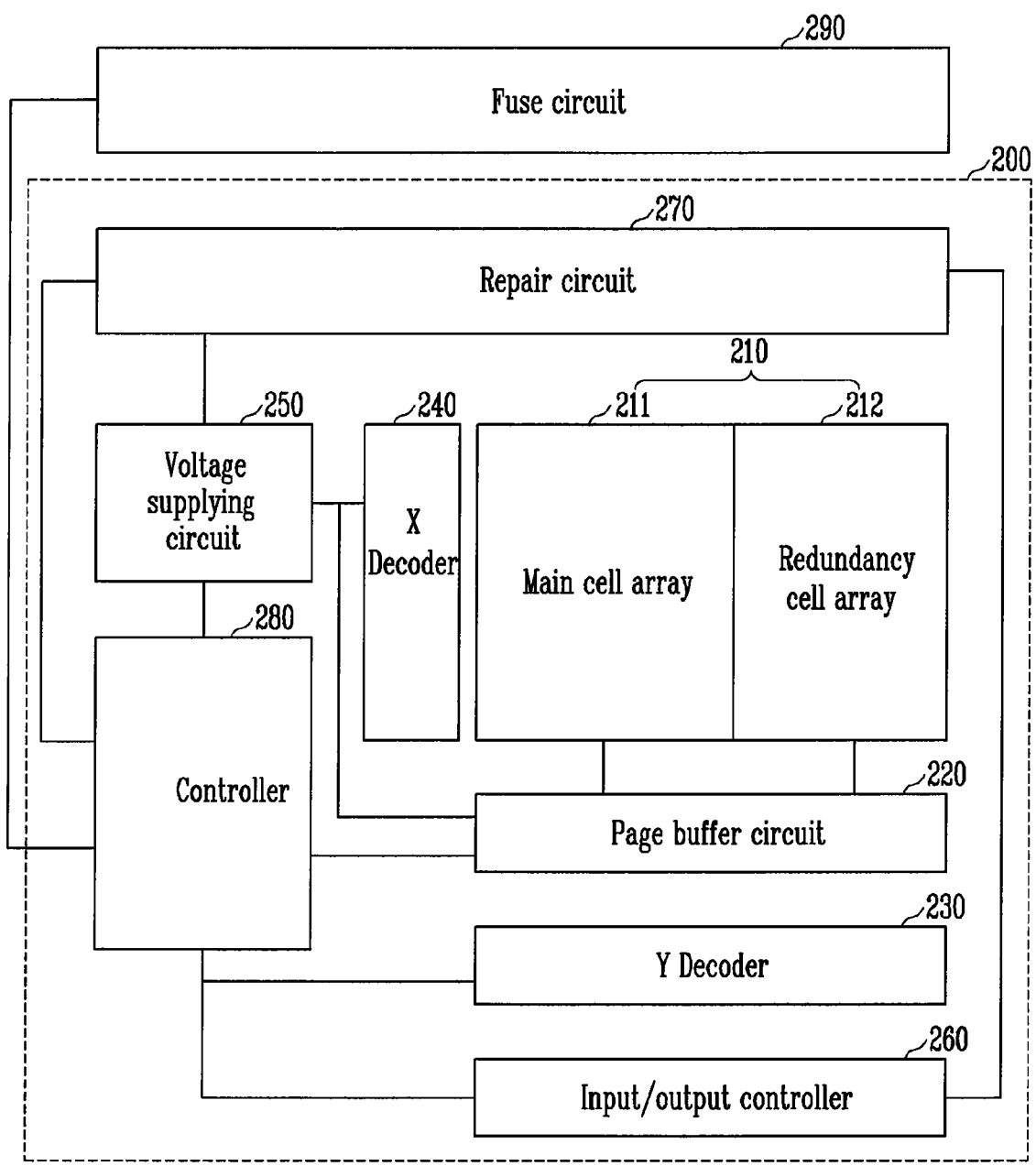
FIG. 2A is a block diagram illustrating a flash memory device according to one example embodiment of the present invention.

FIG. 2A is a block diagram illustrating a flash memory device according to one example embodiment of the present invention.

In FIG. 2A, the flash memory device of the present embodiment includes a flash memory chip 200 and a fuse circuit 290 disposed outside of the flash memory chip 200. The fuse circuit 290 is used for storing option information provided in an initial operation.

The flash memory chip 200 includes a memory cell array 210 having a main cell array 211 and a redundancy cell array 212, a page buffer circuit 220 (having page buffers coupled to bit lines of the memory cell array 210) for programming data to the memory cell or reading data from the memory cell, a Y decoder 230 for providing input/output path of the page buffers in accordance with an input address, a X decoder 240 for selecting word line of the memory cell array 200 in accordance with the input address, a voltage supplying circuit 250 for providing a voltage for operation of the flash memory chip 200, an input/output controller 260 for inputting data to be programmed to the page buffer circuit 220 or outputting the data read from the page buffer circuit 220 to an outside device through the Y decoder 230, and a repair circuit 270 for storing repaired column address information and outputting a repair signal when error has occurred in the main cell array 211. Here, the main cell array 211 has memory cells for storing data, column lines, and word lines.

The fuse circuit 290 includes a plurality of sub-fuse circuits having a memory cell and a transistor.

The sub-fuse circuits are programmed or erased, thereby storing option information for operation of the flash memory chip 200.

The main cell array 211 has memory cells for storing data.

Column lines in the redundancy cell array 212 operate instead of column lines corresponding to memory cells in the main cell array 211 where an error has occurred. Here, the column line corresponds to even bit lines and odd bit lines. In addition, a pair of the even bit line and the odd bit line are coupled to one page buffer.

The page buffer in the page buffer circuit 220 selects one of a pair of bit lines, programs data to a selected memory cell or reads data from the selected memory cell.

The Y decoder 230 provides a path for input/output of data between the page buffer in the page buffer circuit 230 and the input/output controller 260 in accordance with the input address.

The X decoder 240 selects one of the word lines in the memory cell array 210 in accordance with the input address.

The input/output controller 260 inputs data to the page buffer circuit 220 through the path provided by the Y decoder 230 or outputs data outputted from the page buffer circuit 220 to the outside device through the path.

The voltage supplying circuit 280 provides the voltage needed for operation of the flash memory device in accordance with control of a controller 280.

The repair circuit 270 has a plurality of repair address circuits for storing address information of repaired column lines. Here, each of the repair address circuits verifies whether or not an inputted column address is a repaired column address, and outputs the repair signal having the verify result.

Hereinafter, the repair circuit 270 will be described in detail with reference to the accompanying drawings.

Figure 2B:
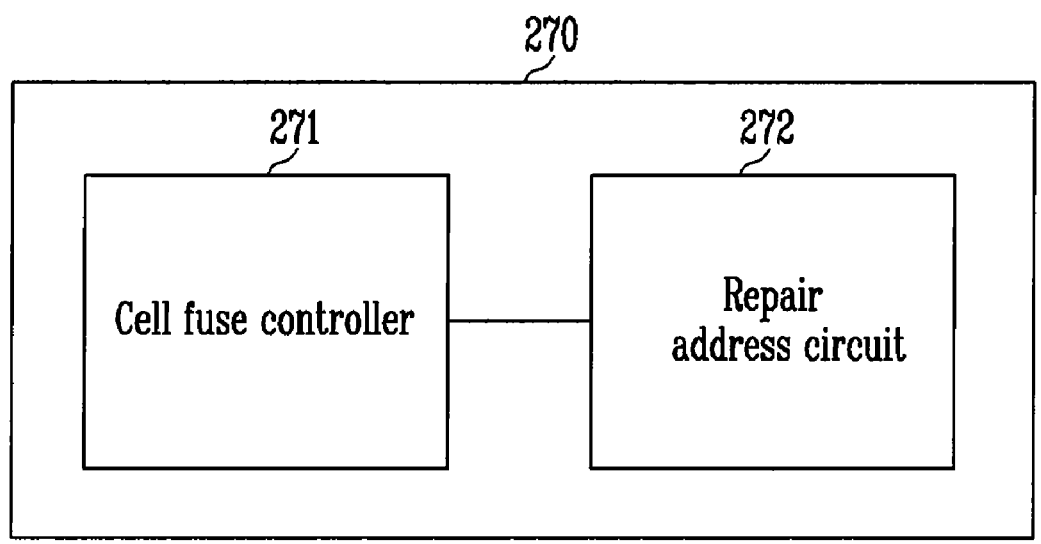
FIG. 2B is a block diagram illustrating the repair circuit in FIG. 2A.

FIG. 2B is a block diagram illustrating the repair circuit in FIG. 2A.

In FIG. 2B, the repair circuit 270 includes a repair address circuit 272 having sub-repair address circuits for storing repaired column address information, and a cell fuse controller 271 for controlling a cell fuse included in the repair address circuit 272.

The repair address circuit 272 has a plurality of cell fuses for storing the repaired column address by programming.

The cell fuse controller 271 programs the cell fuse and verifies a program state.

Hereinafter, the fuse circuit 290 in the flash memory device will be described in detail with reference to the accompanying drawing.

Figure 2C:
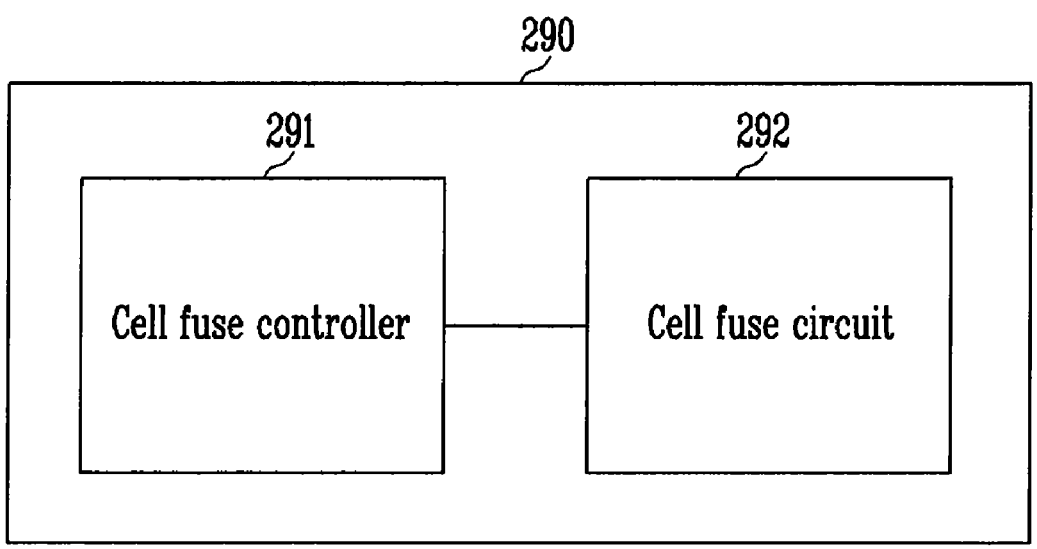
FIG. 2C is a block diagram illustrating the fuse circuit in FIG. 2A.

FIG. 2C is a block diagram illustrating the fuse circuit in FIG. 2A.

In FIG. 2C, the fuse circuit 290 includes a cell fuse circuit 292, having sub-cell fuse circuits, and a cell fuse controller 291 for controlling program and verification of the sub-cell fuse circuits.

Hereinafter, the repair address circuit 272 in FIG. 2B will be described in detail with reference to accompanying drawing.

Figure 2D:
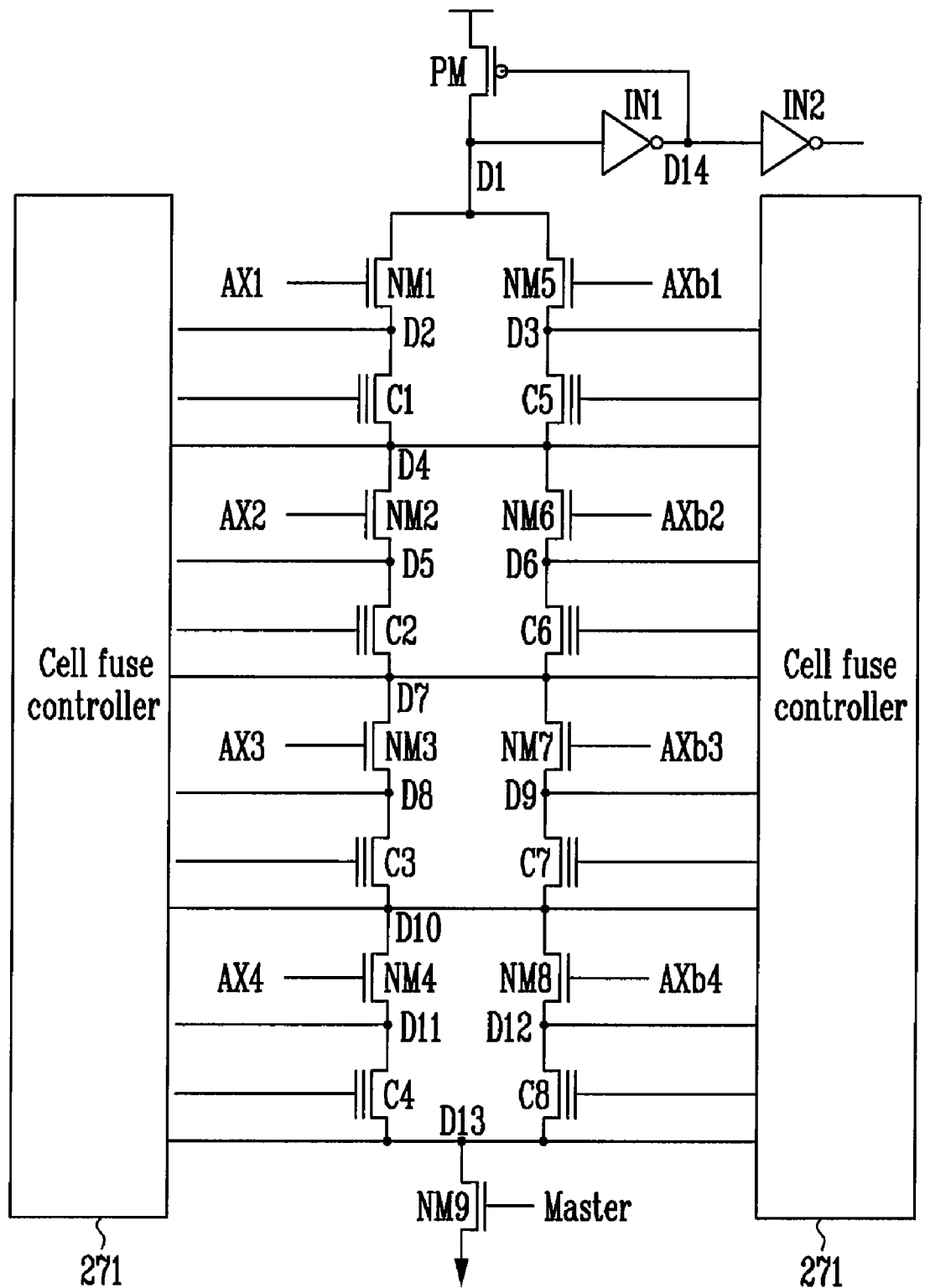
FIG. 2D is a view illustrating the repair address circuit in FIG. 2B.

FIG. 2D is a view illustrating the repair address circuit in FIG. 2B.

In FIG. 2D, the repair address circuit 272 of the present embodiment includes a first to ninth N-MOS transistors N1 to N9, a first to eighth cell fuses C1 to C8, a P-MOS transistor PM, and a first and second inverter IN1 and IN2, and outputs the repair signal in accordance with a first address AX1 to a fourth address AX4.

The P-MOS transistor PM is coupled to a power supply voltage and a node D1, wherein a gate of the P-MOS transistor PM is coupled to a node D14.

The first inverter IN1 is coupled between the node D1 and the node D14.

The second inverter IN2 is coupled to the node D14, inverts a signal of the node D14, and outputs the inverted signal as the repair signal.

The first N-MOS transistor NM1 is coupled between the node D1 and a node D2, wherein the first address AX1 is inputted to a gate of the first N-MOS transistor NM1.

The first cell fuse C1 is coupled between the node D2 and a node D4.

The fifth N-MOS transistor NM5 is coupled between the node D1 and a node D3, wherein an inverted first address AXb1 is transmitted to a gate of the fifth N-MOS transistor NM5.

The fifth cell fuse C5 is coupled between the node D3 and the node D4.

The second N-MOS transistor NM2 is coupled between the node D4 and a node D5, wherein the second address AX2 is inputted to a gate of the second N-MOS transistor NM2.

The second cell fuse C2 is coupled between the node D5 and a node D7.

The sixth N-MOS transistor NM6 is coupled between the node D4 and a node D6, wherein an inverted address AXb2 is inputted to a gate of the sixth N-MOS transistor NM6.

The sixth cell fuse C6 is coupled between the node D6 and the node D7.

The third N-MOS transistor NM3 is coupled between the node D7 and a node D8, wherein the third address AX3 is inputted to a gate of the third N-MOS transistor NM3.

The third cell fuse C3 is coupled between the node D8 and a node D10.

The seventh N-MOS transistor NM7 is coupled between the node D7 and a node D9, wherein an inverted third address AXb3 is inputted to a gate of the seventh N-MOS transistor NM7.

The seventh cell fuse C7 is coupled between the node D9 and the node D10.

The fourth N-MOS transistor NM4 is coupled between the node D10 and a node D11, wherein a fourth address AX4 is inputted to a gate of the fourth N-MOS transistor NM4.

The fourth cell fuse C4 is coupled between the node D11 and a node D13.

The eighth N-MOS transistor NM8 is coupled between the node D10 and a node D12, wherein an inverted fourth address AXb4 is inputted to a gate of the eighth N-MOS transistor NM8.

The ninth N-MOS transistor NM9 is coupled between the node D13 and a ground, and controls operation of the repair address circuit 272 in accordance with a control signal Master.

The first cell fuse C1 to the eight cell fuse C8 are programmed and verified by the cell fuse controller 271.

Fuse cutting is generated in accordance with program of the cell fuses C1 to C8. For example, the first cell fuse C1 is programmed, and then a voltage of 0V is applied to a gate of the first cell fuse C1. In this case, since a threshold voltage of the first cell fuse C1 is changed to a voltage more than 0V by the programming, the first cell fuse C1 is not turned on by the applied voltage of 0V. Accordingly, the first cell fuse C1 maintains a turn-off state, wherein the turn-off state has the same effect as a cutting state of the fuse in the flash memory device in the related art.

The cell fuse controller 271 verifies the program of the cell fuses C1 to C8 so that the cell fuses C1 to C8 operate accurately.

The fuse circuit 290 for storing the option information has a cell fuse and a cell fuse controller like the repair address circuit 272.

Hereinafter, the fuse circuit 290 will be described in detail with reference to accompanying drawing.

Figure 2E:
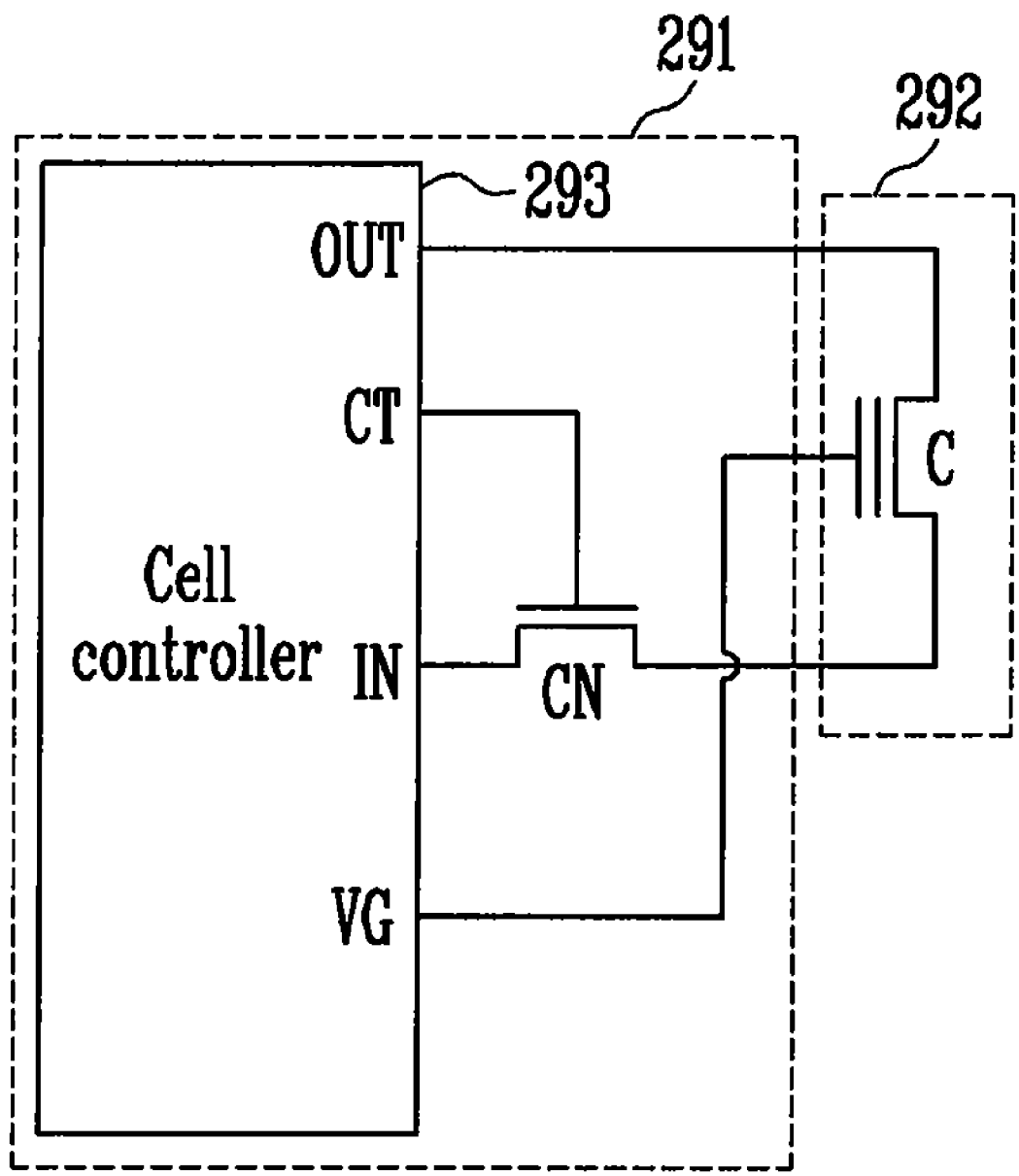
FIG. 2E is a view illustrating the fuse circuit in FIG. 2C.

FIG. 2E is a view illustrating the fuse circuit in FIG. 2C.

FIG. 2E shows one cell fuse C of cell fuses included in the fuse circuit 290 in FIG. 2C and a cell fuse controller 291 for controlling the cell fuse C.

In FIG. 2E, the cell fuse C has the same characteristic as the memory cell for storing data.

The cell fuse controller 291 includes a cell controller 293 for programming the cell fuse C and verifying the program and an N-MOS transistor CN.

The cell controller 293 has an input terminal IN and an output terminal OUT coupled to both terminals of the cell fuse C, and outputs a control signal CT for controlling the N-MOS transistor CN coupled between the input terminal IN and the cell fuse C.

In addition, the cell controller 293 is coupled to a gate of the cell fuse C, and outputs a gate voltage Vg for providing a program voltage, a verifying voltage or an operation voltage, etc to the gate of the cell fuse C.

Hereinafter, a process of programming the cell fuse C will be described in detail. Here, the program of the cell fuse C has the same effect as the fuse cutting in a related art.

The cell controller 293 applies a first program voltage V1 as the gate voltage Vg to the cell fuse C so as to program the cell fuse C. As a result, the cell fuse C is programmed by the first program voltage V1. Here, the program operation is identical to that of a common memory cell.

Subsequently, it is verified whether or not the program is normally performed. To perform the verifying operation, the cell controller 293 transmits the control signal CT having a high level to the N-MOS transistor CN, thereby turning on the N-MOS transistor CN. Additionally, the cell controller 293 outputs a verifying signal through the output terminal OUT, and outputs a program verifying voltage PV as the gate voltage Vg.

In the case that the cell fuse C is programmed, the verifying signal outputted from the output terminal OUT is inputted to the input terminal IN through the cell fuse C.

In case that the cell fuse C is not programmed, the cell fuse C is not turned on by the verifying voltage PV. Accordingly, the verifying signal outputted through the output terminal OUT is not inputted to the input terminal IN.

In the case that the cell fuse C is not programmed, the program verifying voltage is increased. Then, the cell fuse C is programmed again by using a second program voltage V2.

An erase operation is performed by applying respectively 0V and a high voltage to the gate and substrate of the cell fuse C using the cell controller 293 under the condition that the cell fuse C is programmed. Hence, the cell fuse C not programmed normally is erased, and then the cell fuse C is again programmed. That is, the option information stored in the fuse circuit 290 may be changed. Furthermore, the repair address stored in the repair circuit 270 may be changed.

In the case that the flash memory device uses the cell fuse circuit 292, the flash memory device may not have extra elements for fuse cutting. In addition, since the cell fuse is programmed and then erased, data of the cell fuse C may be freely changed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A fuse circuit, comprising:

a plurality of memory cells configured to be turned on or turned off by a first voltage according to a program state of the memory cells;

a switching circuit configured to switch in response to a control signal, thereby transmitting a verifying signal for verifying whether or not the memory cells have been programmed; and a cell controller configured to output the verifying signal for controlling program, verification and erase operations on the memory cells and the control signal, wherein the memory cells are programmed, and are turned off by the first voltage, so as to cut the fuse circuit, and wherein the first voltage is a voltage suitable for turning on the memory cells if the memory cells are in an erased state.

* * * * *